(12) United States Patent
Yim et al.

(10) Patent No.: US 12,310,062 B2
(45) Date of Patent: May 20, 2025

(54) INTEGRATED CIRCUIT DEVICES INCLUDING STACKED TRANSISTORS AND METHODS OF FORMING THE SAME

(71) Applicant: Samsung Electronics Co., Ltd., Suwon-si (KR)

(72) Inventors: Jeonghyuk Yim, Halfmoon, NY (US); Kang-Ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 598 days.

(21) Appl. No.: 17/574,043

(22) Filed: Jan. 12, 2022

(65) Prior Publication Data

US 2023/0142609 A1   May 11, 2023

Related U.S. Application Data

(60) Provisional application No. 63/278,152, filed on Nov. 11, 2021.

(51) Int. Cl.
| | |
|---|---|
| *H10D 30/67* | (2025.01) |
| *H10D 62/834* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/6735* (2025.01); *H10D 62/834* (2025.01); *H10D 84/0181* (2025.01); *H10D 84/038* (2025.01); *H10D 84/859* (2025.01)

(58) Field of Classification Search
CPC ............ H01L 27/0924; H01L 27/0922; H10D 30/6735
See application file for complete search history.

(56) References Cited

U.S. PATENT DOCUMENTS

| | | |
|---|---|---|
| 9,842,777 B2 | 12/2017 | Witters et al. |
| 10,991,626 B2 | 4/2021 | Smith et al. |
| 11,043,493 B2 | 6/2021 | Bi et al. |
| 2014/0197377 A1* | 7/2014 | Kim .................... H01L 29/0676 257/29 |
| 2015/0263088 A1* | 9/2015 | Cheng .................... H01L 21/84 438/283 |
| 2017/0133277 A1 | 5/2017 | Kim et al. |
| 2019/0172755 A1 | 6/2019 | Smith et al. |
| 2020/0006331 A1 | 1/2020 | Lilak et al. |
| 2020/0294866 A1 | 9/2020 | Cheng et al. |

(Continued)

*Primary Examiner* — Erik Kielin
(74) *Attorney, Agent, or Firm* — Myers Bigel, P.A.

(57) ABSTRACT

Integrated circuit devices may include a stacked structure including an upper transistor on a substrate and a lower transistor between the substrate and the upper transistor. The upper transistor may include an upper gate electrode, an upper active region in the upper gate electrode, and an upper gate insulator between the upper gate electrode and the upper active region. The upper active region may include an inner layer including a first semiconductor material and an outer layer that extends between the inner layer and the upper gate insulator and includes a second semiconductor material that is different from the first semiconductor material. The lower transistor may include a lower gate electrode, a lower active region in the lower gate electrode, and a lower gate insulator between the lower gate electrode and the lower active region.

15 Claims, 26 Drawing Sheets

(56) References Cited

U.S. PATENT DOCUMENTS

2022/0310456 A1\* 9/2022 Hall ................ H01L 21/823807
2023/0086633 A1\* 3/2023 Frougier ........... H01L 29/66439
257/369

\* cited by examiner

INTEGRATED CIRCUIT DEVICES INCLUDING STACKED TRANSISTORS AND METHODS OF FORMING THE SAME

CROSS-REFERENCE TO RELATED APPLICATION

This application claims priority to U.S. Provisional Application Ser. No. 63/278,152, entitled STACKED INTEGRATED CIRCUIT DEVICES INCLUDING HETEROCHANNELS, filed in the USPTO on Nov. 11, 2021, the disclosure of which is hereby incorporated by reference herein in its entirety.

FIELD

The present disclosure generally relates to the field of electronics and, more particularly, to integrated circuit devices including stacked transistors.

BACKGROUND

An integrated circuit device including stacked transistors, such as a complementary field effect transistor (CFET) stack, was introduced to reduce an area thereof to close to one-half of the area of a corresponding non-stacked device. Though it is beneficial to include multiple stacked transistors having different threshold voltages in a device, for example, to reduce leakage power, it may be difficult to form transistors having different threshold voltages using conventional methods as upper transistors overlap lower transistors.

SUMMARY

According to some embodiments of the present inventive concept, integrated circuit devices may include a first stacked structure including a first upper transistor on a substrate and a first lower transistor between the substrate and the first upper transistor. The first upper transistor may include a first upper gate electrode, a first upper active region in the first upper gate electrode, and a first upper gate insulator between the first upper gate electrode and the first upper active region. The first upper active region may include an inner layer including a first semiconductor material and an outer layer that extends between the inner layer and the first upper gate insulator and includes a second semiconductor material that is different from the first semiconductor material. The first lower transistor may include a first lower gate electrode, a first lower active region in the first lower gate electrode, and a first lower gate insulator between the first lower gate electrode and the first lower active region.

According to some embodiments of the present inventive concept, integrated circuit devices may include a stacked structure including an upper transistor on a substrate and a lower transistor between the substrate and the upper transistor. The upper transistor may include an upper gate electrode including side surfaces that are spaced apart from each other in a first horizontal direction and an upper active region in the upper gate electrode. The upper active region may include an inner layer and an outer layer enclosing the inner layer when viewed in a cross-section taken along a second horizontal direction that is different from the first horizontal direction, and the inner layer and the outer layer may include comprise different materials. The lower transistor may include a lower gate electrode and a lower active region in the lower gate electrode.

According to some embodiments of the present inventive concept, methods of forming an integrated circuit device may include providing a preliminary structure on a substrate. The preliminary structure may include an insulating layer including an opening, a preliminary upper active region in the opening and a lower active region that is in the opening and is between the substrate and the preliminary upper active region. The methods may also include forming an inner layer by etching the preliminary upper active region, forming an outer layer on the inner layer, forming a lower gate electrode in the opening on the lower active region, and forming an upper gate electrode in the opening on the outer layer.

DETAILED DESCRIPTION

According to example embodiments of the present invention, upper transistors of stacked transistors may have different threshold voltages because of different materials of active regions. Accordingly, upper transistors having different threshold voltages may be formed without multiple patterning of gate electrode layers (e.g., gate work function layers), which are difficult to perform when upper transistors are stacked on lower transistors.

Figure 1:
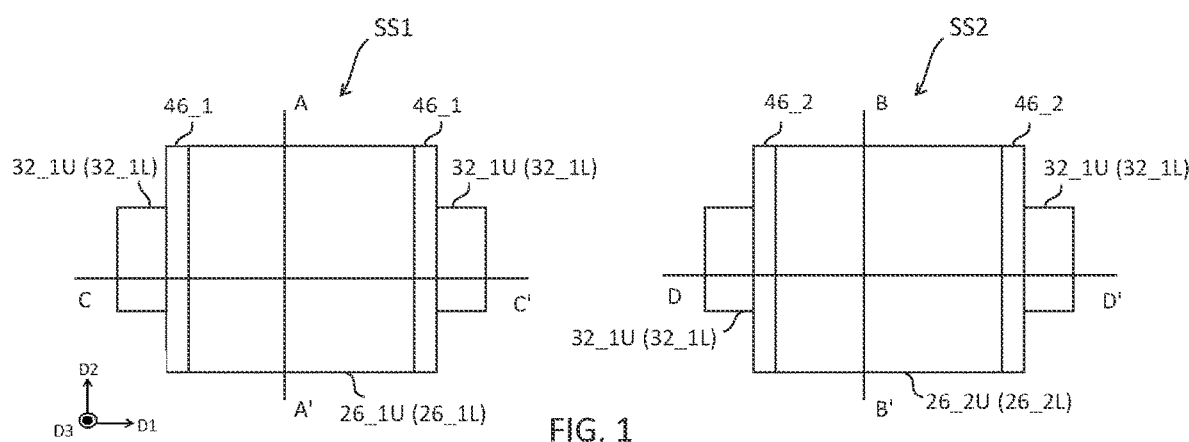
FIG. 1 illustrates a layout of an integrated circuit device according to some embodiments of the present invention.
Figure 2:
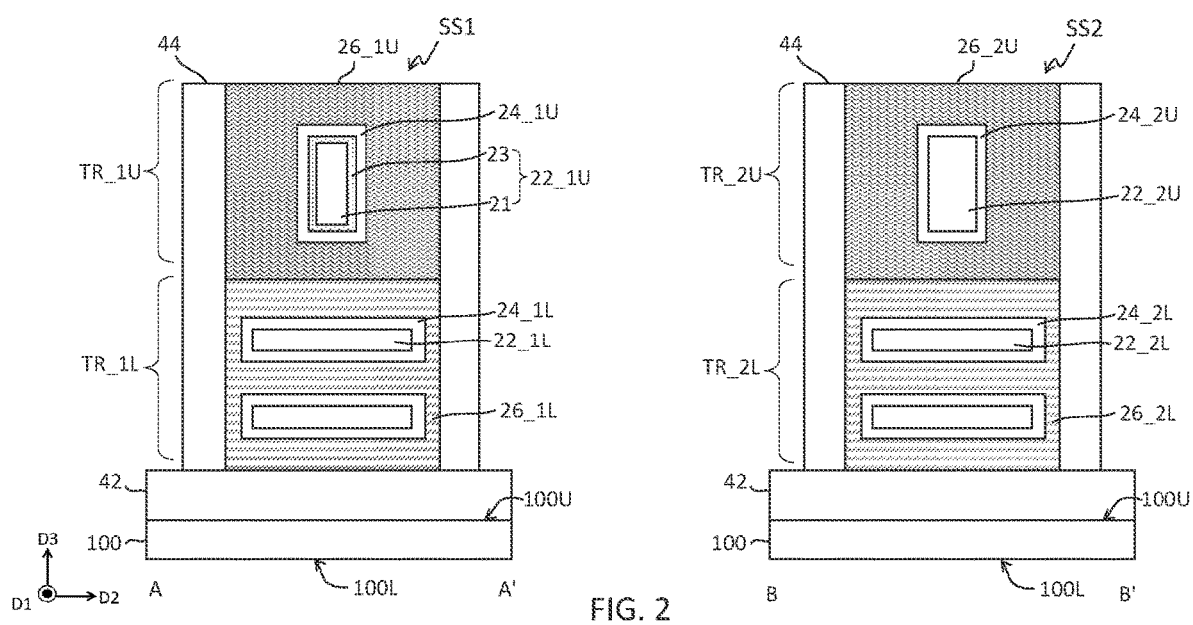
FIG. 2 illustrates cross-sectional views of the integrated circuit device taken along the lines A-A' and B-B' in FIG. 1 according to some embodiments of the present invention.
Figure 3:
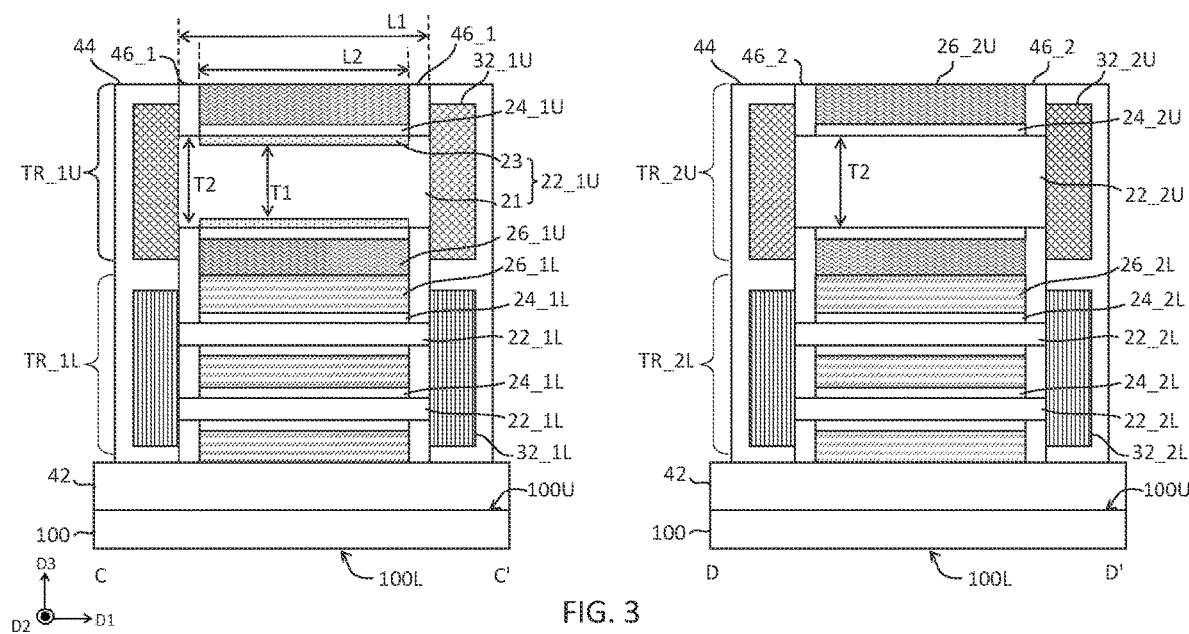
FIG. 3 illustrates cross-sectional views of the integrated circuit device taken along the lines C-C' and D-D' in FIG. 1 according to some embodiments of the present invention.

FIG. 1 illustrates a layout of an integrated circuit device according to some embodiments of the present invention, FIG. 2 illustrates cross-sectional views of the integrated circuit device taken along the lines A-A' and B-B' in FIG. 1 according to some embodiments of the present invention, and FIG. 3 illustrates cross-sectional views of the integrated circuit device taken along the lines C-C' and D-D' in FIG. 1 according to some embodiments of the present invention.

Referring to FIGS. 1 through 3, the integrated circuit device may include a first stacked structure SS1 and a second stacked structure SS2 on a substrate 100. Although FIG. 1 illustrates that the second stacked structure SS2 is spaced apart from the first stacked structure SS1 in a first direction D1, the present invention is not limited thereto. The second stacked structure SS2 may be spaced apart from the first stacked structure SS1 in another direction (e.g., a second direction D2) that is different from the first direction D1.

The first direction D1 may be parallel to an upper surface 100U of the substrate 100 and may be a first horizontal direction. The substrate 100 may also include a lower surface 100L opposite the upper surface 100U. The upper surface 100U may face the first stacked structure SS1 and the second stacked structure SS2 as illustrated in FIG. 2. The second direction D2 may also be parallel to the upper surface 100U of the substrate 100 and may be a second horizontal direction. The first direction D1 and the second direction D2 may be different from each other. In some embodiments, the first direction D1 and the second direction D2 may be perpendicular to each other.

The first stacked structure SS1 may include a first upper transistor TR_1U and a first lower transistor TR_1L that may be between the substrate 100 and the first upper transistor TR_1U. The first upper transistor TR_1U may overlap the first lower transistor TR_1L in a third direction D3. The third direction D3 may be perpendicular to the upper surface 100U of the substrate 100 and may be a vertical direction. As used herein, "an element A overlapping an element B in a direction X" (or similar language) means that there is at least one line that extends in the direction X and intersects both the elements A and B. In some embodiments, the integrated circuit device may be a monolithic stacked device, and the first upper transistor TR_1U and the first lower transistor TR_1L may be formed on a single substrate (e.g., the substrate 100).

In some embodiments, a first insulating layer 42 may be provided between the substrate 100 and the first lower transistor TR_1L as illustrated in FIGS. 2 and 3 to reduce a leakage current through the substrate 100. In some embodiments, the first insulating layer 42 may be omitted, and the first lower transistor TR_1L may contact the upper surface 100U of the substrate 100. The first stacked structure SS1 may be provided in a second insulating layer 44.

The first upper transistor TR_1U may include a first upper gate electrode 26_1U, and the first lower transistor TR_1L may include a first lower gate electrode 26_1L that may be between the substrate 100 and the first upper gate electrode 26_1U. The first upper gate electrode 26_1U may overlap the first lower gate electrode 26_1L in the third direction D3.

Each of the first upper gate electrode 26_1U and the first lower gate electrode 26_1L may include opposing side surfaces that may be spaced apart from each other in the first direction D1. The first stacked structure SS1 may also include first upper source/drain regions 32_1U that are on the opposing side surfaces of the first upper gate electrode 26_1U, respectively, and may include first lower source/drain regions 32_1L that are on the opposing side surfaces of the first lower gate electrode 26_1L, respectively. The first upper source/drain regions 32_1U may overlap the first lower source/drain regions 32_1L, respectively, in the third direction D3.

First gate spacers 46_1 may be on (e.g., may contact) the opposing side surfaces of the first upper gate electrode 26_1U and may separate the first upper gate electrode 26_1U from the first upper source/drain regions 32_1U. The first upper gate electrode 26_1U may be electrically isolated from the first upper source/drain regions 32_1U by the first gate spacers 46_1. The first gate spacers 46_1 may also be on (e.g., may contact) the opposing side surfaces of the first lower gate electrode 26_1L and may separate the first lower gate electrode 26_1L from the first lower source/drain regions 32_1L. The first lower gate electrode 26_1L may be electrically isolated from the first lower source/drain regions 32_1L by the first gate spacers 46_1.

The first upper transistor TR_1U may also include a first upper active region 22_1U in the first upper gate electrode 26_1U and a first upper gate insulator 24_1U between the first upper active region 22_1U and the first upper gate electrode 26_1U. The first upper active region 22_1U may contact the first upper gate insulator 24_1U, and the first upper gate insulator 24_1U may contact the first upper gate electrode 26_1U. As used herein, the term "active region" may be interchangeable with "channel region" because a channel is formed in at least a portion (e.g., an outer portion) of the active region when a transistor is turned on. Further, as used herein, "an element A being in an element B" (or similar language) means that the element B surrounds at least a portion of the element A.

The first upper active region 22_1U may include an inner layer 21 and an outer layer 23 that may extend between the inner layer 21 and the first upper gate insulator 24_1U. The outer layer 23 may contact the inner layer 21 and may completely enclose the inner layer 21 when viewed in a cross-section taken along the second direction D2 as illustrated in FIG. 2. In some embodiments, each of the inner layer 21 and the outer layer 23 may be a single layer. The inner layer 21 and the outer layer 23 may include different semiconductor materials. In some embodiments, the inner layer 21 may be a semiconductor layer including a Group IV element, and the outer layer 23 may be a semiconductor layer including a Group IV-IV semiconductor compound or a Group III-V semiconductor compound. For example, the inner layer 21 may be a silicon layer, and the outer layer 23 may be a silicon germanium layer.

In some embodiments, the first lower transistor TR_1L and the first upper transistor TR_1U may have different conductivity types, and the first stacked structure SS1 may be a complementary field effect transistor (CFET) stack. For example, the first upper transistor TR_1U may be a P-type transistor, and the first lower transistor TR_1L may be an N-type transistor. If the outer layer 23 is a silicon germanium layer when the first upper transistor TR_1U is a P-type transistor, a threshold voltage of the first upper transistor TR_1U may decrease compared to the case where the first upper active region 22_1U is a single silicon layer.

Referring to FIG. 3, the inner layer 21 may contact the first upper source/drain regions 32_1U and may have a first length L1 in the first direction D1. The inner layer 21 may include a middle portion that is in the first upper gate electrode 26_1U and edge portions. Each of the edge portions of the inner layer 21 is between the middle portion of the inner layer 21 and a respective one of the first upper source/drain regions 32_1U. The middle portion of the inner layer 21 may have a first thickness T1 in the third direction D3, and the edge portions of the inner layer 21 may have a second thickness T2 in the third direction D3. The second thickness T2 may be thicker than the first thickness T1. For example, a difference between the second thickness T2 and the first thickness T1 may be in a range of 1 nm to 20 nm.

In some embodiments, the outer layer 23 may be provided only on the middle portion of the inner layer 21 and may have a second length L2 in the first direction D1, which is shorter than the first length L1. The outer layer 23 may be spaced apart from the first upper source/drain regions 32_1U. The edge portions of the inner layer 21 may contact respective side surfaces of the outer layer 23 and may separate the outer layer 23 from the first upper source/drain regions 32_1U.

In some embodiments, the outer layer 23 may have a uniform thickness on the inner layer 21 as illustrated in FIGS. 2 and 3. For example, the outer layer 23 may have a thickness in a range of 1 nanometer (nm) to 10 nm.

The first lower transistor TR_1L may also include a first lower active region 22_1L in the first lower gate electrode 26_1L and a first lower gate insulator 24_1L between the first lower active region 22_1L and the first lower gate electrode 26_1L. The first lower active region 22_1L may contact the first lower gate insulator 24_1L, and the first lower gate insulator 24_1L may contact the first lower gate electrode 26_1L. The first lower transistor TR_1L may include two first lower active regions 22_1L as illustrated in FIG. 2. Each of the first lower active regions 22_1L may be a nanosheet (e.g., a silicon nanosheet), and each of the first lower active regions 22_1L may have a thickness in a range of from 1 nm to 100 nm in the third direction D3. In some embodiments, the first lower transistor TR_1L may include one or three or more first lower active regions 22_1L.

Although FIGS. 2 and 3 illustrate each of the first upper gate electrode 26_1U and the first lower gate electrode 26_1L as a single layer, each of the first upper gate electrode 26_1U and the first lower gate electrode 26_1L may include multiple layers. For example, each of the first upper gate electrode 26_1U and the first lower gate electrode 26_1L may include a main gate electrode layer (e.g., a metal layer and/or a doped semiconductor layer) on the first upper active region 22_1U or the first lower active region 22_1L and a gate work function layer between the main gate electrode layer and the first upper active region 22_1U or the first lower active region 22_1L. The gate work function layer may be an n-type work function layer (e.g., TiC layer, TiAl layer or TiAlC layer) or a p-type work function layer (e.g., TiN layer) depending on a conductivity type of the first upper transistor TR_1U and the first lower transistor TR_1L.

Further, although FIGS. 2 and 3 illustrate each of the first upper gate insulator 24_1U and the first lower gate insulator 24_1L as a single layer, each of first upper gate insulator 24_1U and the first lower gate insulator 24_1L may include multiple layers. For example, each of the first upper gate insulator 24_1U and the first lower gate insulator 24_1L may include an interfacial layer (e.g., silicon oxide layer) contacting an active region (e.g., the first upper active region 22_1U or the first lower active region 22_1L) and a high-k material layer on the interfacial layer. The high-k material layer may include hafnium silicate, zirconium silicate, hafnium dioxide and/or zirconium dioxide.

Still referring to FIGS. 1 through 3, the second stacked structure SS2 may include a second upper transistor TR_2U and a second lower transistor TR_2L that may be between the substrate 100 and the second upper transistor TR_2U. The second upper transistor TR_2U may overlap the second lower transistor TR_2L in the third direction D3.

The second upper transistor TR_2U may include a second upper gate electrode 26_2U, a second upper active region 22_2U in the second upper gate electrode 26_2U, and a second upper gate insulator 24_2U between the second upper active region 22_2U and the second upper gate electrode 26_2U. The second upper transistor TR_2U may be the same as or similar to the first upper transistor TR_1U with primary differences being that the second upper active region 22_2U may be a single layer, and the second upper active region 22_2U may have a uniform thickness (e.g., the second thickness T2) in the third direction D3 along the first direction D1. The second upper active region 22_2U may have a thickness in the third direction D3 that is thicker than the first thickness T1 of the middle portion of the inner layer 21.

In some embodiments, the second upper active region 22_2U may include a semiconductor material that is the same as the inner layer 21 of the first upper active region 22_1U and is different from the outer layer 23 of the first upper active region 22_1U. Accordingly, the first upper transistor TR_1U and the second upper transistor TR_2U may have different threshold voltages even when the first upper gate electrode 26_1U and the second upper gate electrode 26_2U include the same materials. In some embodiments, the first upper transistor TR_1U and the second upper transistor TR_2U may be P-type transistors, and the first upper transistor TR_1U may have a lower threshold voltage than the second upper transistor TR_2U when the outer layer 23 is a silicon germanium layer.

The second lower transistor TR_2L may include a second lower gate electrode 26_2L, a second lower active region 22_2L in the second lower gate electrode 26_2L, and a second lower gate insulator 24_2L between the second lower active region 22_2L and the second gate electrode 26_2L. Elements of the second lower transistor TR_2L may be the same as or similar to elements of the first lower transistor TR_1L.

The second stacked structure SS2 may also include second gate spacers 46_2 that may be provided between the second upper gate electrode 26_2U and the second upper source/drain regions 24_2U and between the second lower gate electrode 26_2L and the second lower source/drain regions 24_2L for electrical isolation therebetween.

The substrate 100 may include one or more semiconductor materials, for example, Si, Ge, SiGe, GaP, GaAs, SiC, SiGeC and/or InP. In some embodiments, the substrate 100 may be a bulk substrate (e.g., a bulk silicon substrate) or a semiconductor on insulator (SOI) substrate.

Each of the inner layer 21, the first lower active region 22_1L, the second upper active region 22_2U, and the second lower active region 22_2L may include semiconductor material(s) (e.g., silicon, germanium, silicon-germanium) and may also include impurities (e.g., boron, aluminum, gallium, indium, phosphorus, and/or arsenic). In some embodiments, the inner layer 21, the first lower active region 22_1L, the second upper active region 22_2U, and the second lower active region 22_2L may include the same material (e.g., silicon) and each may be, for example, a silicon layer.

Each of the first upper source/drain regions 32_1U, the first lower source/drain regions 32_1L, the second upper source/drain regions 32_2U, and the second lower source/drain regions 32_2L may include semiconductor material(s) (e.g., silicon, germanium, silicon-germanium) and may also include impurities (e.g., boron, aluminum, gallium, indium, phosphorus, and/or arsenic).

Each of the first insulating layer 42, the second insulating layer 44, the first gate spacers 46_1 and the second gate spacers 46_2 may include an insulating material (e.g., silicon oxide, silicon nitride, silicon oxynitride and/or a low k material). The low k material may include, for example, fluorine-doped silicon dioxide, organosilicate glass, carbondoped oxide, porous silicon dioxide, porous organosilicate glass, spin-on organic polymeric dielectric, or spin-on silicon based polymeric dielectric.

Figure 4:
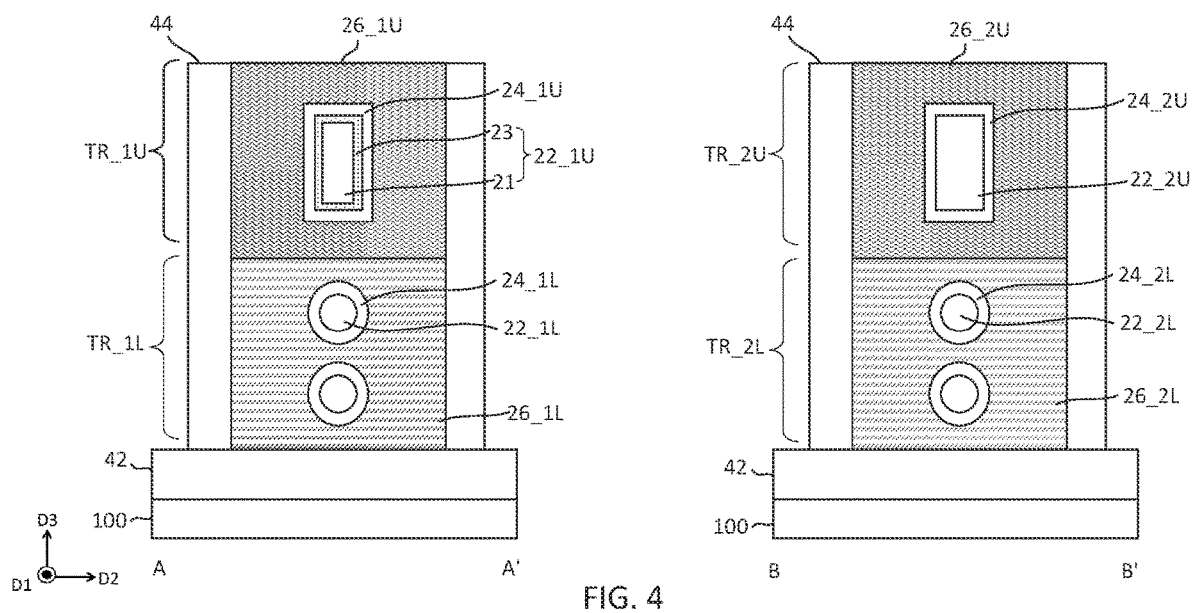
FIGS. 4 and 5 illustrate cross-sectional views of integrated circuit devices taken along the lines A-A' and B-B' in FIG. 1 according to some embodiments of the present invention.
Figure 5:
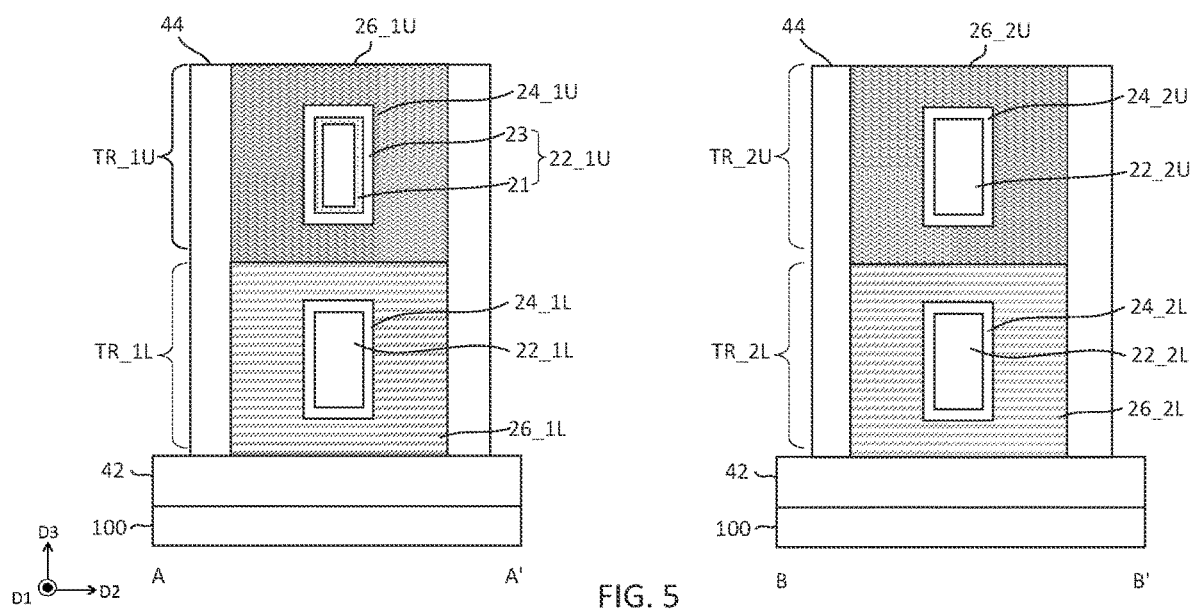

FIGS. 4 and 5 illustrate cross-sectional views of integrated circuit devices taken along the lines A-A' and B-B' in FIG. 1 according to some embodiments of the present invention. The integrated circuit devices illustrated in FIGS. 4 and 5 are the same as or similar to the integrated circuit devices illustrated in FIGS. 2 and 3 with a primary difference being that first and second lower active regions 22_1L and 22_2L in FIGS. 4 and 5 have shapes different from the first and second lower active regions 22_1L and 22_2L in FIGS. 2 and 3.

Referring to FIG. 4, a first lower transistor TR_1L may include multiple (e.g., two) nanowires as first lower active regions 24_1L, and a second lower transistor TR_2L may include multiple (e.g., two) nanowires as second lower active regions 24_2L. Each of the nanowires may have a circular cross section and a radius of the nanowires may be in a range of 1 nm to 100 nm.

Referring to FIG. 5, a first lower transistor TR_1L may include a first lower active regions 24_1L having a fin shape, and a second lower transistor TR_2L may include a second lower active regions 24_2 having a fin shape.

Figure 6:
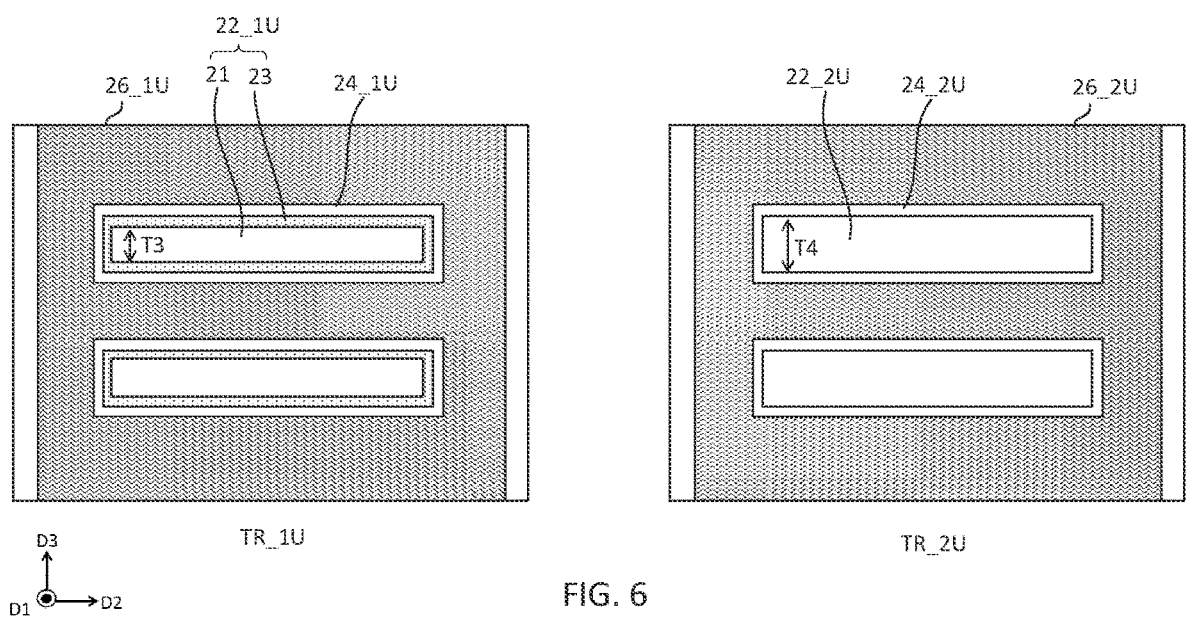
FIGS. 6 and 7 illustrate cross-sectional views of first and second upper transistors taken along the lines A-A' and B-B' in FIG. 1 according to some embodiments of the present invention.
Figure 7:
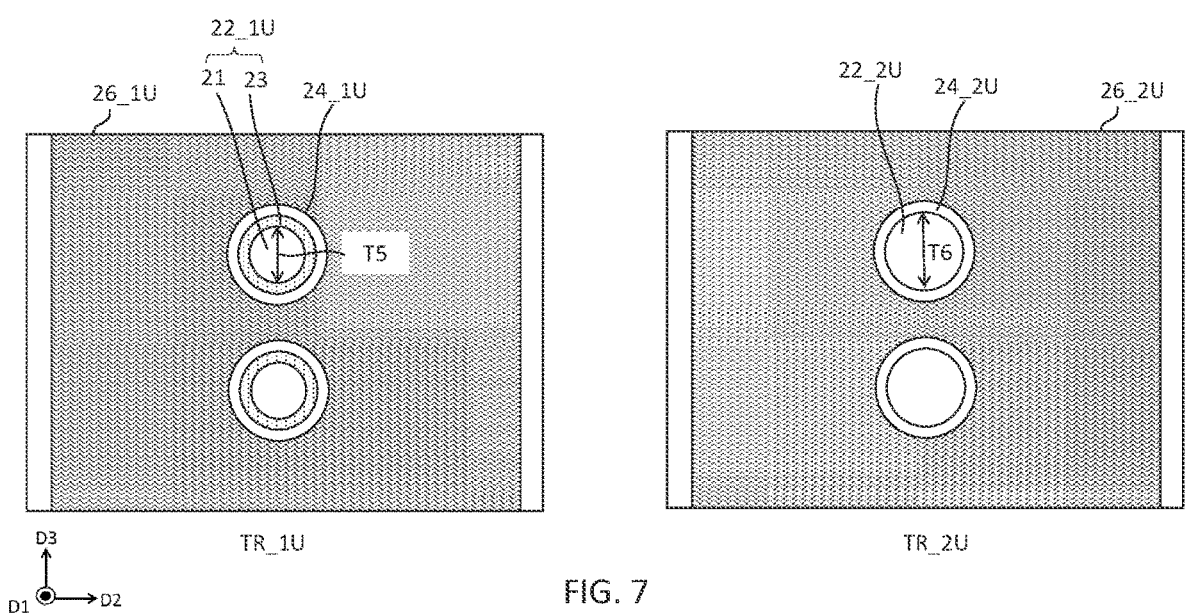

FIGS. 6 and 7 illustrate cross-sectional views of first and second upper transistors TR_1U and TR_2U taken along the lines A-A' and B-B' in FIG. 1 according to some embodiments of the present invention.

In some embodiments, the first upper transistor TR_1U may include multiple nanosheets, each of which is an inner layer 21 of the first upper active regions 22_1U, and the second upper transistor TR_2U may include multiple nanosheets, each of which is a second upper active region 22_2U, as illustrated in FIG. 6. Each of the inner layers 21 may include a middle portion that is in the first upper gate electrode 26_1U and may have a third thickness T3 in the third direction D3, and each of the second upper active regions 22_2U may have a fourth thickness T4 in the third direction D3. The fourth thickness T4 may be greater than the third thickness T3. For example, a difference between the fourth thickness T4 and the third thickness T3 may be in a range of 1 nm to 20 nm. Although FIG. 6 illustrates each of the first upper transistor TR_1U and the second upper transistor TR_2U include two nanosheets, each of the first upper transistor TR_1U and the second upper transistor TR_2U may include various numbers of nanosheets (e.g., one or three or more).

In some embodiments, the first upper transistor TR_1U may include multiple nanowires, each of which is an inner layer 21 of the first upper active regions 22_1U, and the second upper transistor TR_2U may include multiple nanowires, each of which is a second upper active region 22_2U, as illustrated in FIG. 7. Each of the inner layers 21 may include a middle portion that is in the first upper gate electrode 26_1U and may have a fifth thickness T5 in the third direction D3 (e.g., a diameter of the nanowire), and each of the second upper active regions 22_2U may have a sixth thickness T6 in the third direction D3 (e.g., a diameter of the nanowire). The sixth thickness T6 may be greater than the fifth thickness T5. For example, a difference between the sixth thickness T6 and the fifth thickness T5 may be in a range of 1 nm to 20 nm. Although FIG. 7 illustrates each of the first upper transistor TR_1U and the second upper transistor TR_2U includes two nanowires, each of the first upper transistor TR_1U and the second upper transistor TR_2U may include various numbers of nanowires (e.g., one or three or more).

Figure 8:
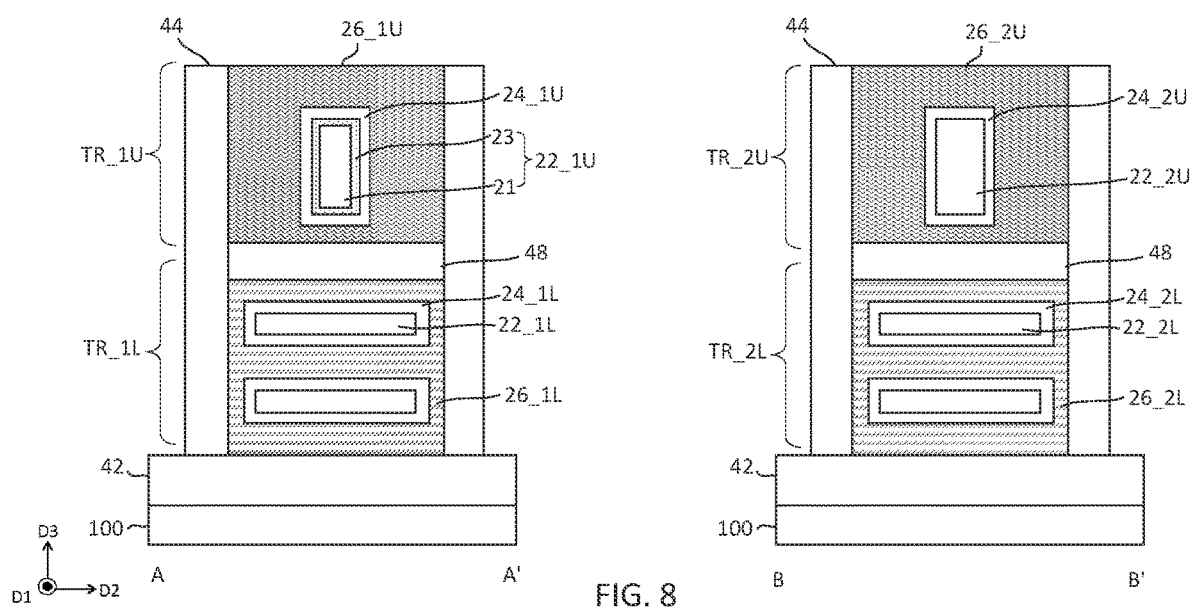
FIG. 8 illustrates cross-sectional views of an integrated circuit device taken along the lines A-A' and B-B' in FIG. 1 according to some embodiments of the present invention.
Figure 9:
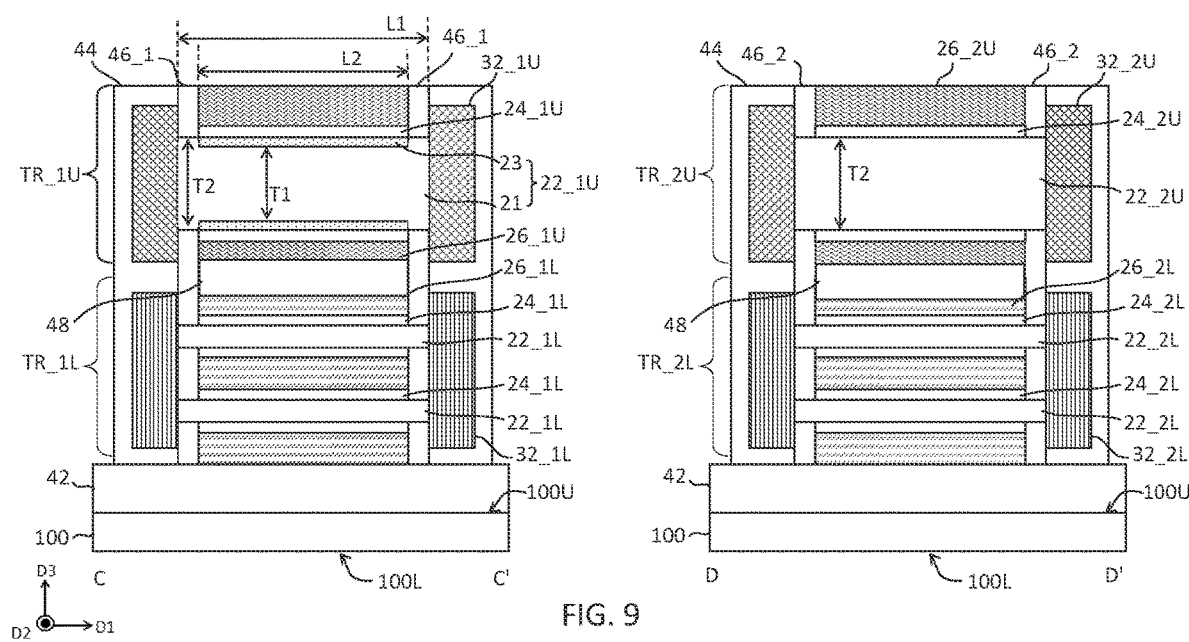
FIG. 9 illustrates cross-sectional views of the integrated circuit device taken along the lines C-C' and D-D' in FIG. 1 according to some embodiments of the present invention.

FIG. 8 illustrates cross-sectional views of an integrated circuit device taken along the lines A-A' and B-B' in FIG. 1 according to some embodiments of the present invention, and FIG. 9 illustrates cross-sectional views of the integrated circuit device taken along the lines C-C' and D-D' in FIG. 1 according to some embodiments of the present invention. The integrated circuit device illustrated in FIGS. 8 and 9 is the same as or similar to the integrated circuit device illustrated in FIGS. 2 and 3 with a primary difference being that a stack insulating layer 48 may be provided between an upper gate electrode (e.g., the first upper gate electrode 26_1U or the second upper gate electrode 26_2U) and a lower gate electrode (e.g., the first lower gate electrode 26_1L or the second lower gate electrode 26_2L), thereby separating the upper gate electrode from the lower gate electrode. The stack insulating layer 48 may include an insulating material (e.g., silicon oxide, silicon oxynitride, silicon nitride and/or low k material).

Figure 10:
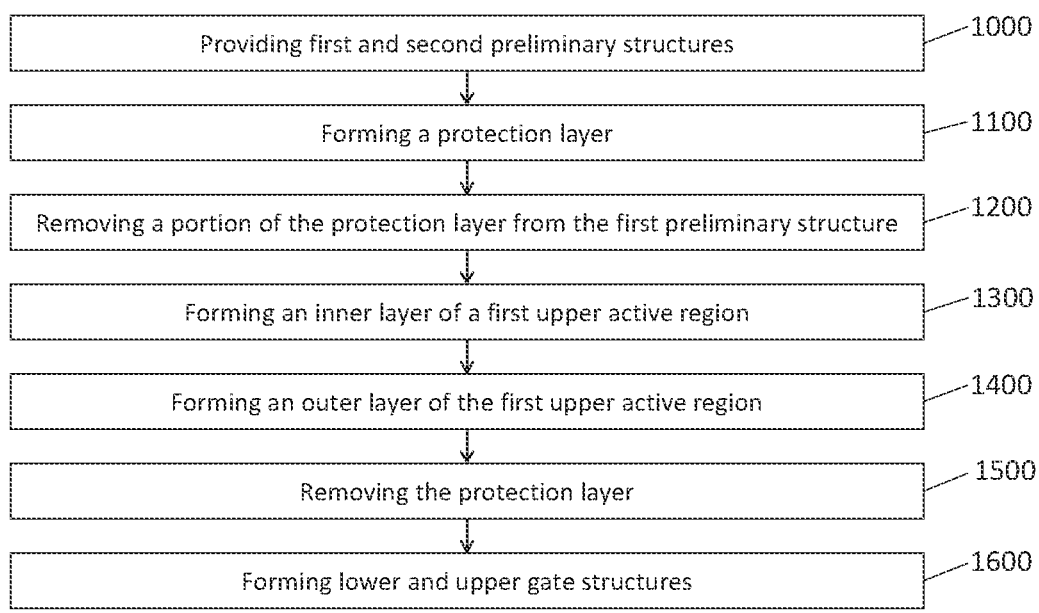
FIG. 10 is a flow chart of methods of forming an integrated circuit device according to some embodiments of the present invention.

FIG. 10 is a flow chart of methods of forming an integrated circuit device according to some embodiments of the present invention, and FIGS. 11 through 20 are cross-sectional views illustrating methods of forming an integrated circuit device according to some embodiments of the present invention. FIGS. 11, 13 through 16, 18 and 20 illustrate cross-sectional views taken along the lines A-A' and B-B' in FIG. 1, and FIGS. 12, 17 and 19 illustrate cross-sectional views taken along the lines C-C' and D-D' in FIG. 1.

Figure 11:
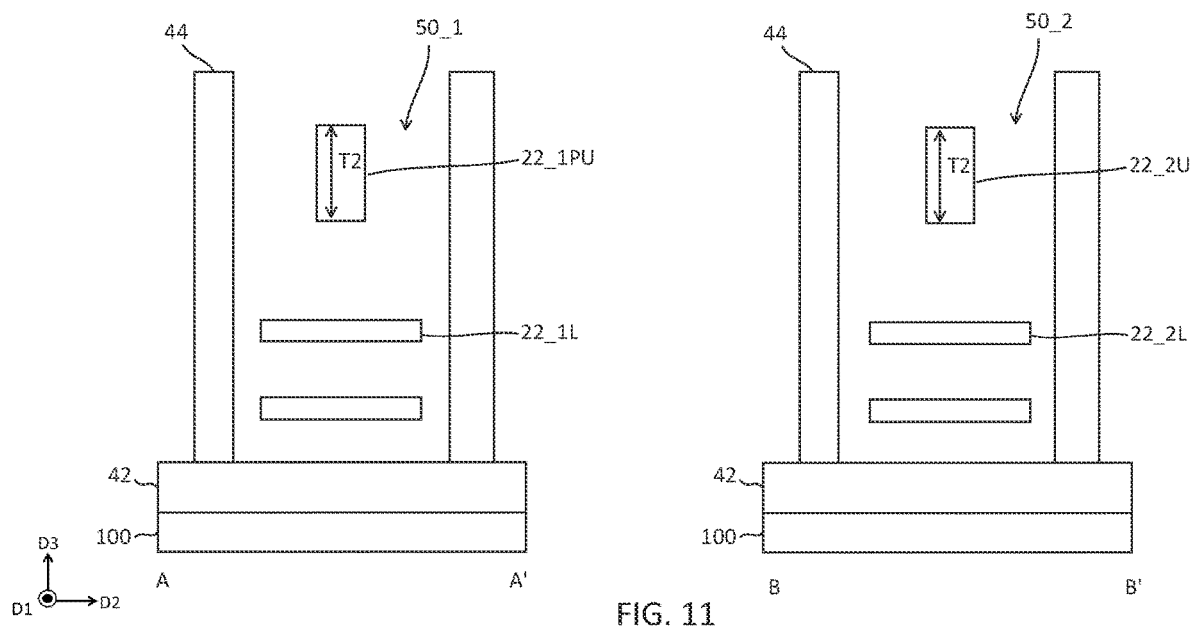
FIGS. 11 through 20 are cross-sectional views illustrating methods of forming an integrated circuit device according to some embodiments of the present invention.
Figure 12:
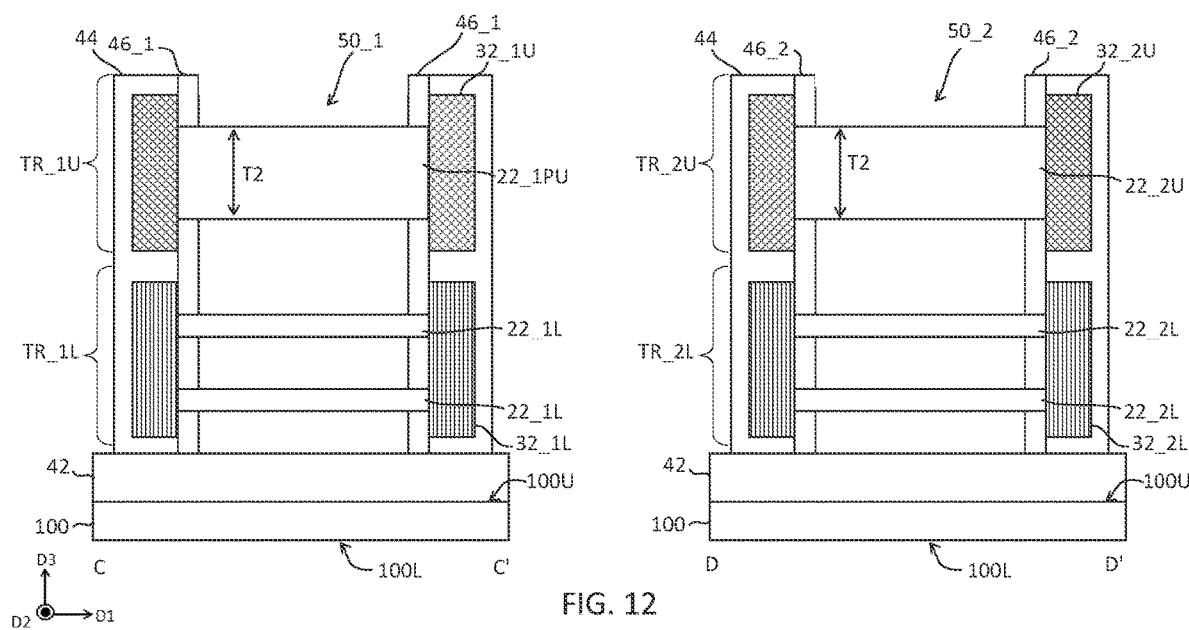

Referring to FIGS. 10 through 12, the methods may include providing first and second preliminary structures (Block 1000). The first preliminary structure may include a preliminary first upper active region 22_1PU and a first lower active region 22_1L in a first opening 50_1 of the second insulating layer 44, first upper source/drain regions 32_1U contacting opposing side surfaces of the preliminary first upper active region 22_1PU, first lower source/drain regions 32_1L contacting opposing side surfaces of the first lower active region 22_1L and first gate spacers 46_1. The preliminary first upper active region 22_1PU may include edge portions that may be spaced part from each other in the first direction D1 and may be in the first gate spacers 46_1, respectively. The first gate spacers 46_1 may contact the edge portions of the preliminary first upper active region 22_1PU, respectively. A middle portion of the preliminary first upper active region 22_1PU between the edge portions may be exposed to the first opening 50_1.

The second preliminary structure may include a second upper active region 22_2U and a second lower active region 22_2L in a second opening 50_2 of the second insulating layer 44, second upper source/drain regions 32_2U contacting opposing side surfaces of the second upper active region 22_2U, second lower source/drain regions 32_2L contacting opposing side surfaces of the second lower active region 22_2L and second gate spacers 46_2.

Each of the preliminary first upper active region 22_1PU and the second upper active region 22_2U may have a uniform thickness (e.g., the second thickness T2) in the third direction D3 along the first direction D1.

Figure 13:
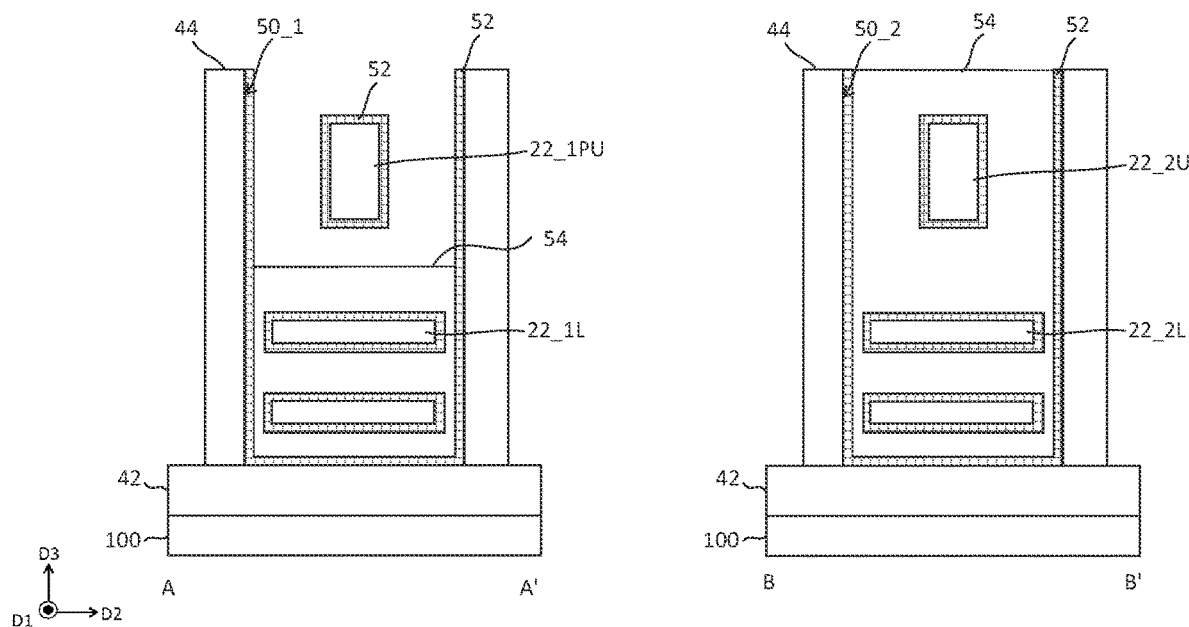

Referring to FIGS. 10 and 13, a protection layer 52 may be formed in the first opening 50_1 and the second opening 50_2 (Block 1100). The protection layer 52 may be formed by a conformal deposition process (e.g., an atomic layer deposition (ALD)), and the protection layer 52 may have a uniform thickness on surfaces of the preliminary first upper active region 22_1PU, the first lower active region 22_1L, the second upper active region 22_2U, and the second lower active region 22_2L and on inner surfaces of the first opening 50_1 and the second opening 50_2. A mask layer 54 may be formed in a lower portion of the first opening 50_1 and may be formed in the second opening 50_2. The mask layer 54 may expose the protection layer 52 formed on the preliminary first upper active region 22_1PU as illustrated in FIG. 13. For example, a preliminary mask layer may be formed in the first opening 50_1 and the second second opening 50_2 and then a portion of the preliminary mask layer formed in an upper portion of the first opening 50_1 may be removed to expose the protection layer 52 formed on the preliminary first upper active region 22_1PU.

The protection layer 52 may include a material different from the mask layer 54 and may have an etch selectivity with respect to the mask layer 54. Further, the protection layer 52 may include a material different from the preliminary first upper active region 22_1PU and may have an etch selectivity with respect to the preliminary first upper active region 22_1PU. For example, the protection layer 52 may include silicon oxide, silicon nitride and/or silicon oxynitride, and the mask layer 54 may be an optical planarization layer (OPL) and/or a spin on hardmask layer (SOH). The protection layer 52 may have a thickness in a range of 1 nm to 10 nm.

Figure 14:
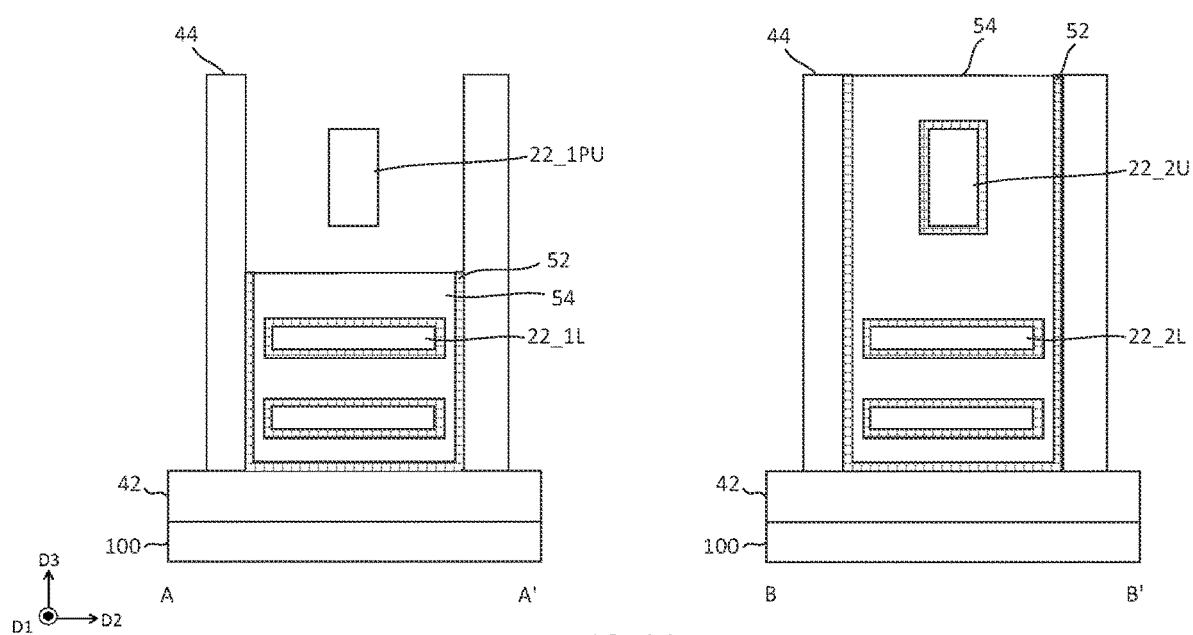

Referring to FIGS. 10 and 14, a portion of the protection layer 52 that is not covered by the mask layer 54 may be removed from the first preliminary structure (Block 1200), thereby exposing the preliminary first upper active region 22_1PU.

Figure 15:
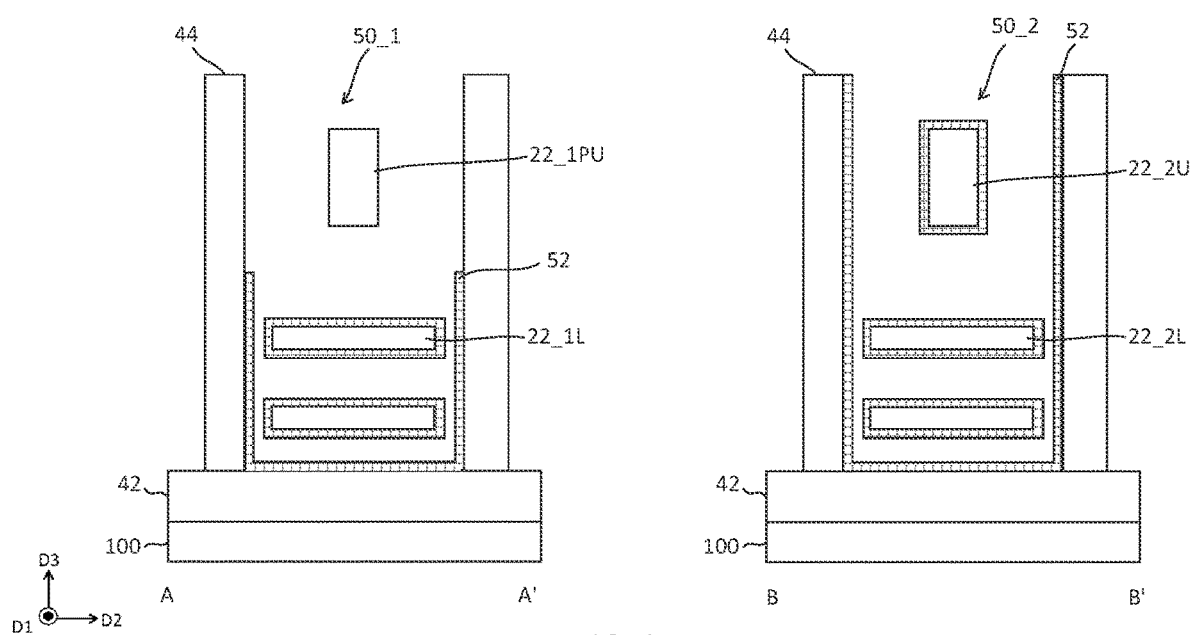

Referring to FIG. 15, the mask layer 54 may be removed from the first opening 50_1 and the second opening 50_2.

Figure 16:
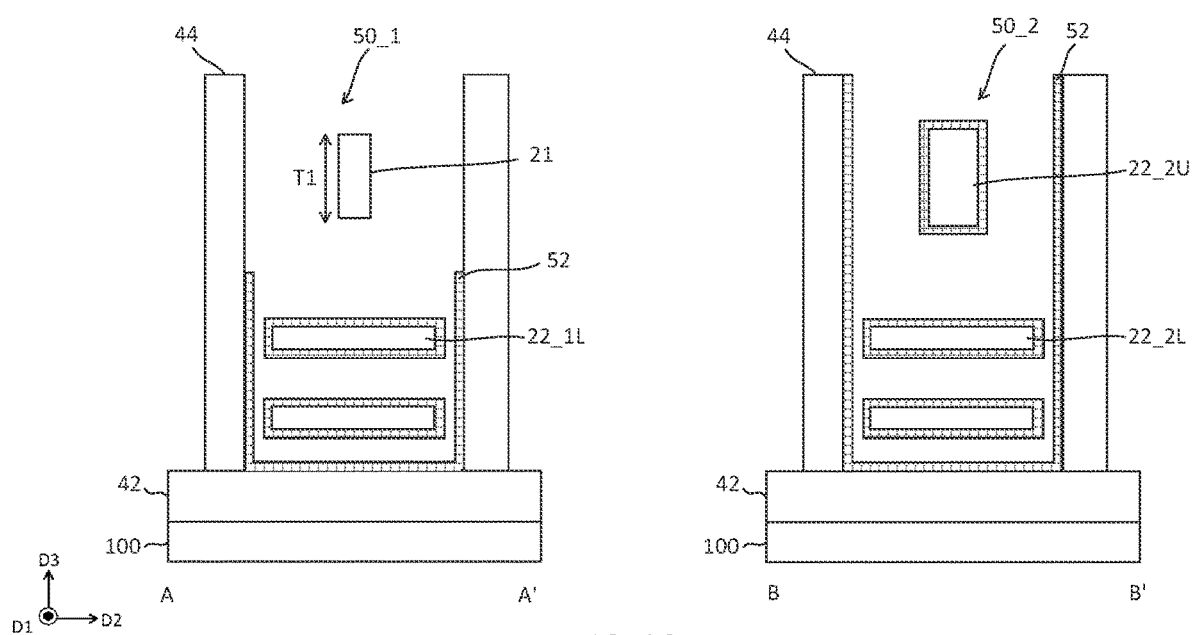
Figure 17:
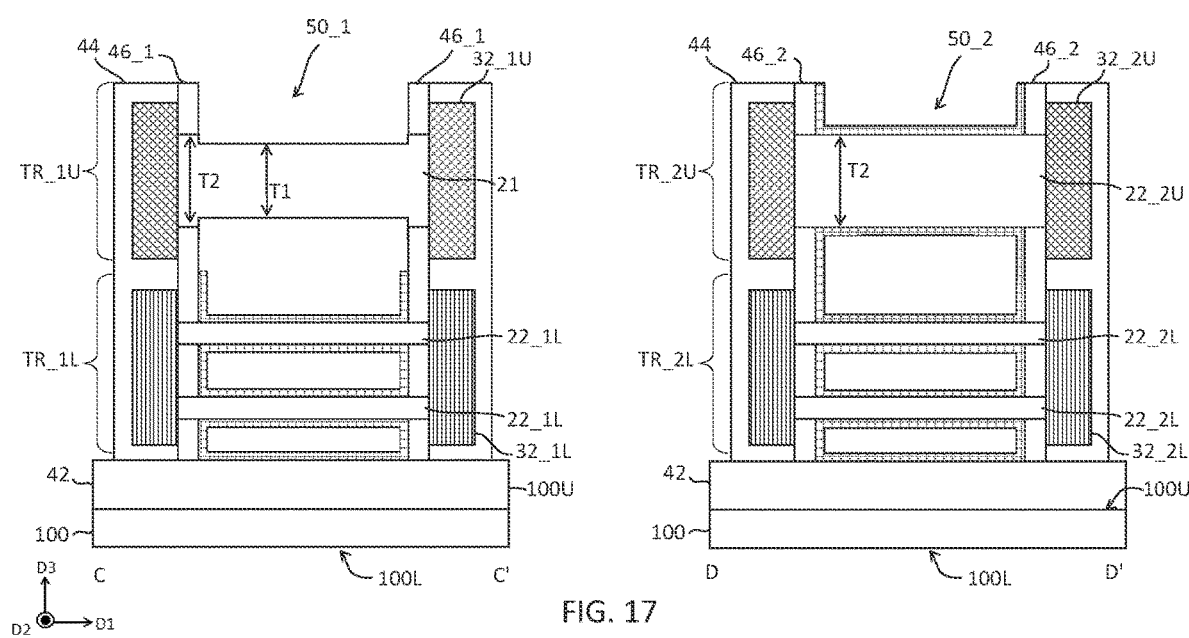

Referring to FIGS. 10, 16 and 17, an inner layer 21 may be formed (Block 1300) by removing (e.g., an isotopically etching) a portion of the preliminary first upper active region 22_1PU exposed to the first opening 50_1. A portion of the inner layer 21 (e.g., a middle portion of the inner layer 21) exposed to the first opening 50_1 may have a first thickness T1 in the third direction D3, and the first thickness T1 is thinner than the second thickness T2 of the preliminary first upper active region 22_1PU. The edge portions of the preliminary first upper active region 22_1PU that are in the first gate spacers 46_1 may not be etched and thus a thickness of thereof may not reduce. All elements covered by the protection layer 52 may not be etched while etching preliminary first upper active region 22_1PU.

Figure 18:
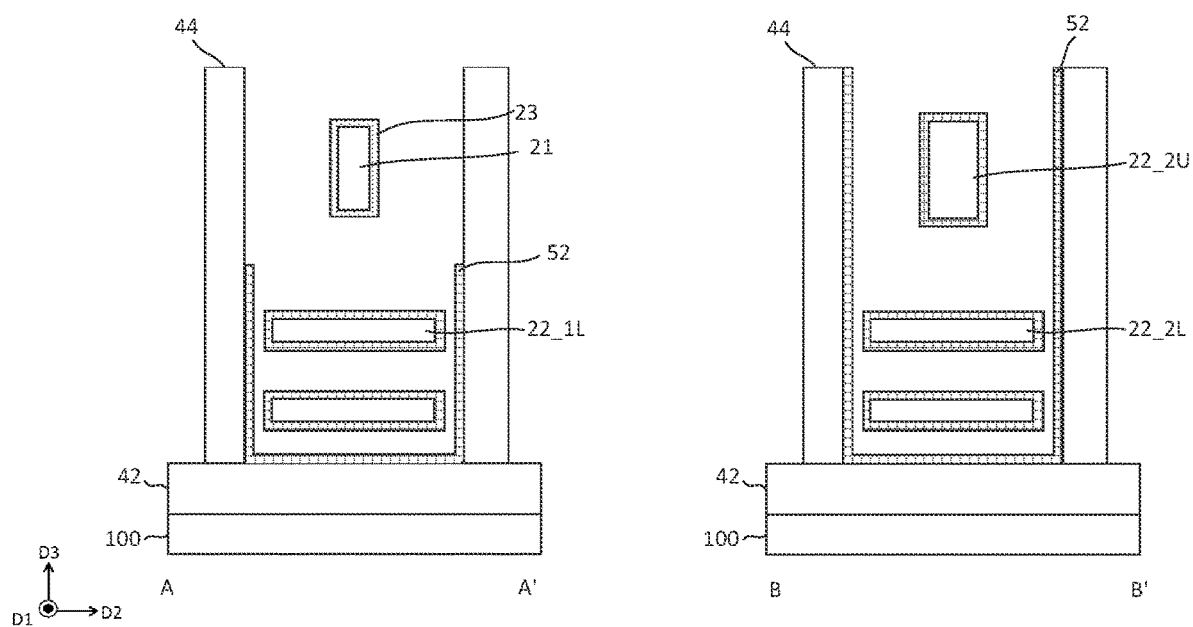
Figure 19:
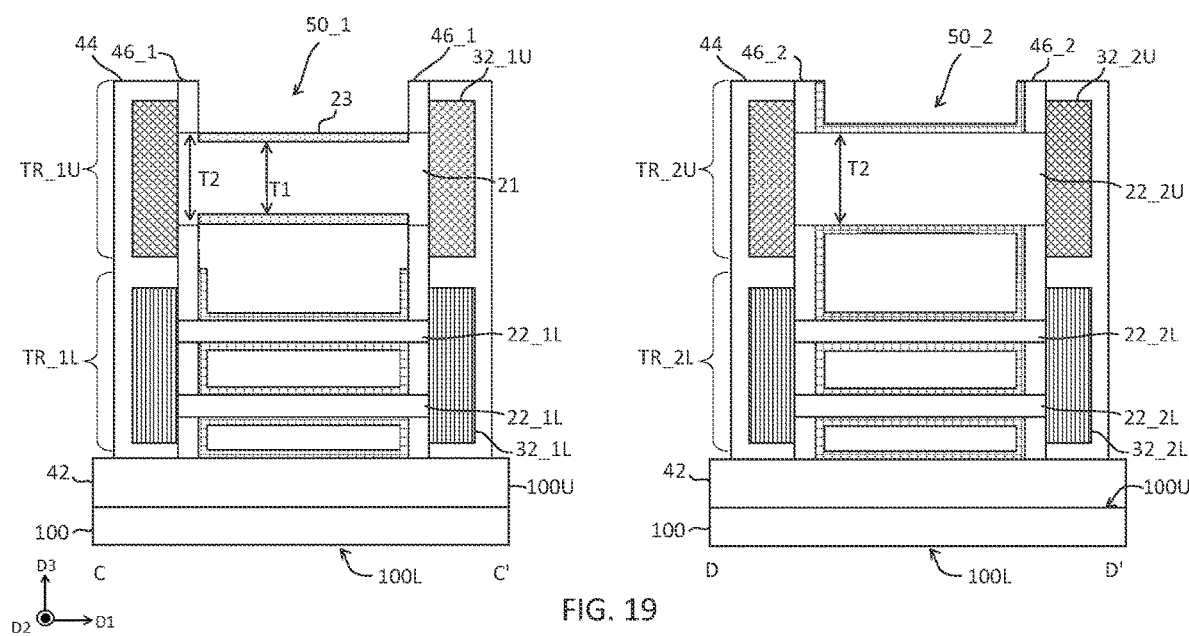

Referring to FIGS. 10, 18 and 19, an outer layer 23 may be formed (Block 1400) by, for example, performing an epitaxial growth process using the inner layer 21 as a seed layer. The outer layer 23 may contact the inner layer 21. The outer layer 23 may have a uniform thickness on the inner layer 21 as illustrated in FIGS. 18 and 19.

Figure 20:
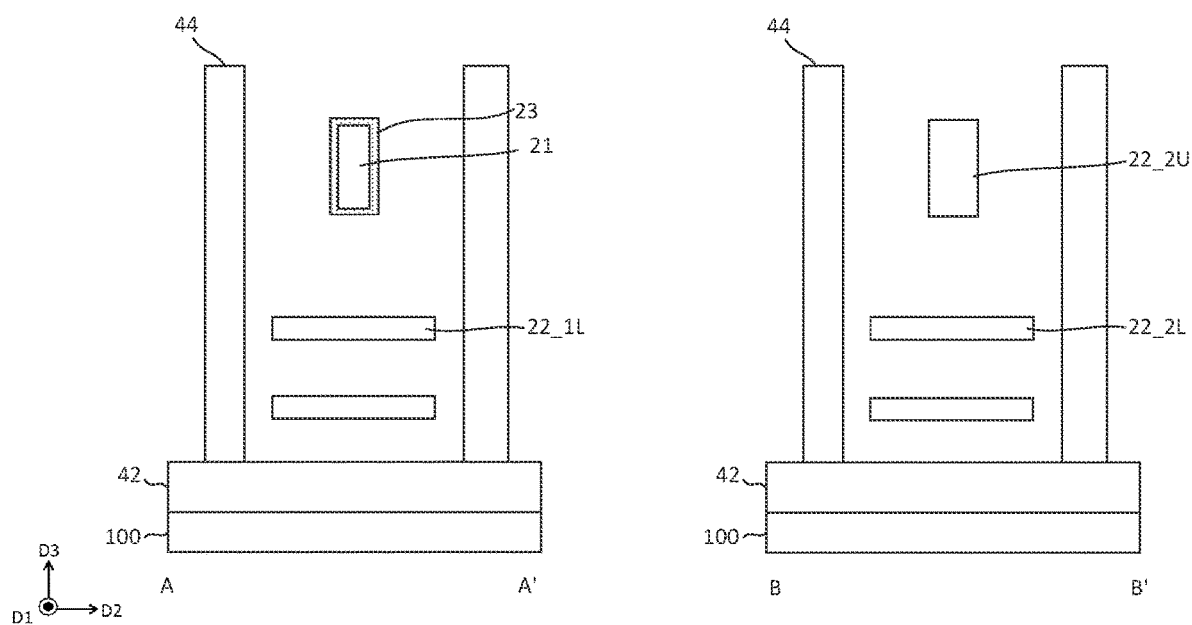

Referring to FIGS. 10 and 20, the protection layer 52 may be removed (Block 1500). Referring to FIG. 10 and FIGS. 2 and 3, lower gate structures and upper gate structures may be formed (Block 1600). The lower gate structures may include a first lower gate structure including the first lower gate insulator 24_1L and the first lower gate electrode 26_1L and a second lower gate structure including the second lower gate insulator 24_2L and the second lower gate electrode 26_2L. The upper gate structures may include a first upper gate structure including the first upper gate insulator 24_1U and the first upper gate electrode 26_1U and a second upper gate structure including the second upper gate insulator 24_2U and the second upper gate electrode 26_2U.

Figure 21:
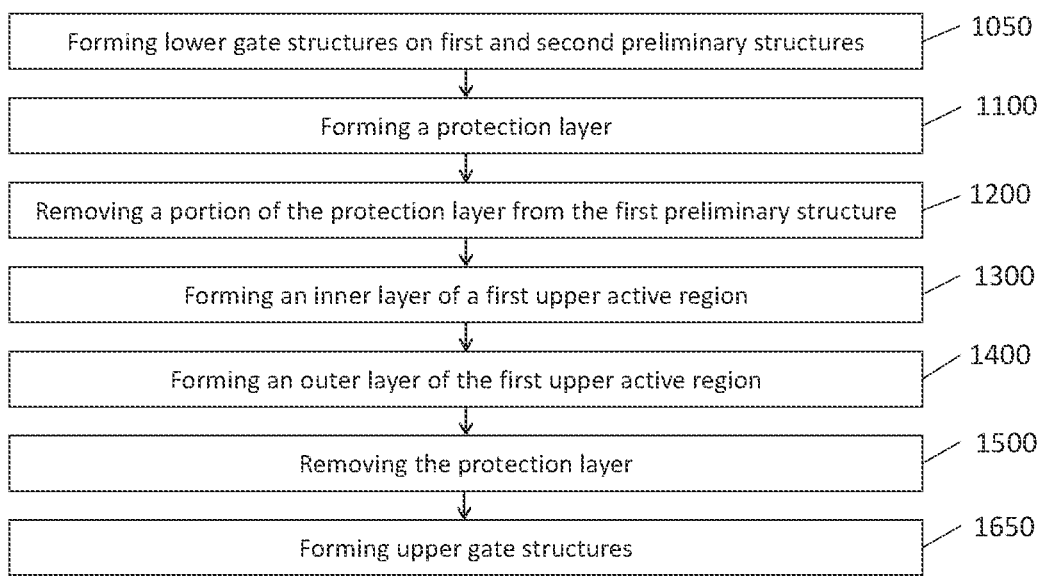
FIG. 21 is a flow chart of methods of forming an integrated circuit device according to some embodiments of the present invention.

FIG. 21 is a flow chart of methods of forming an integrated circuit device according to some embodiments of the present invention, and FIGS. 22 through 26 are cross-sectional views illustrating methods of forming an integrated circuit device according to some embodiments of the present invention. FIGS. 22 through 26 are cross-sectional views taken along the lines A-A' and B-B' in FIG. 1. The methods described in FIG. 21 are the same as or similar to the methods in FIG. 10 with a primary difference being that a lower gate structure may be formed before forming a protection layer.

Figure 22:
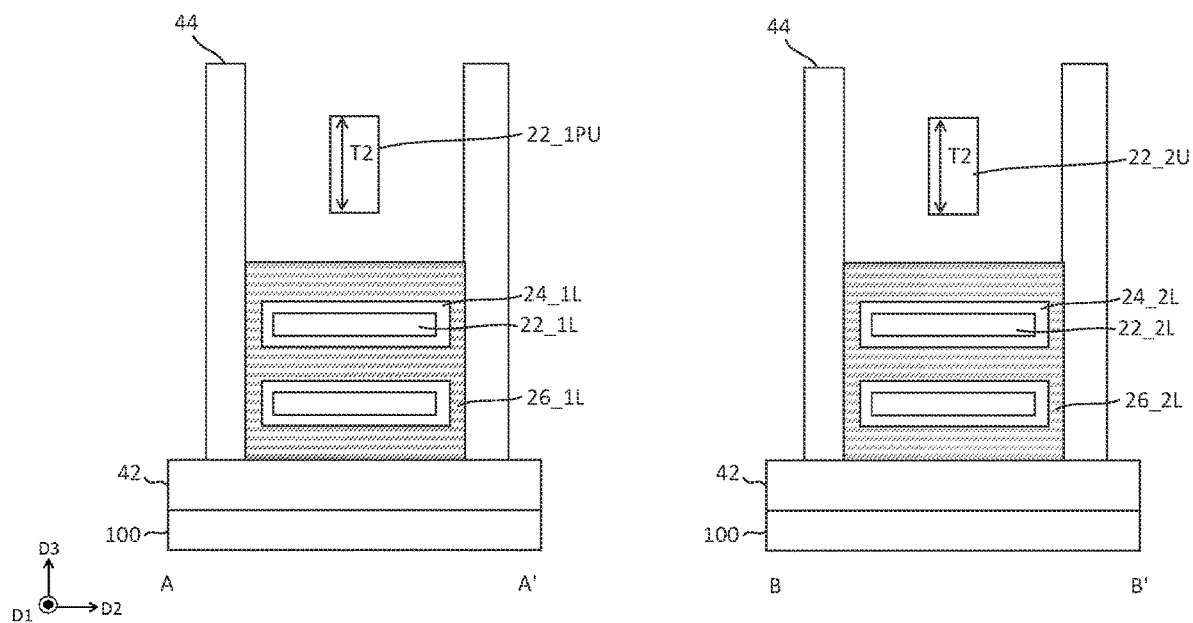
FIGS. 22 through 26 are cross-sectional views illustrating methods of forming an integrated circuit device according to some embodiments of the present invention.

Referring to FIGS. 21 and 22, the methods may include forming lower gate structures (Block 1050) in first and second preliminary structures (e.g., the first and second preliminary structures in FIG. 11). The lower gate structures may include a first lower gate structure including the first lower gate insulator 24_1L and the first lower gate electrode 26_1L and a second lower gate structure including the second lower gate insulator 24_2L and the second lower gate electrode 26_2L.

Figure 23:
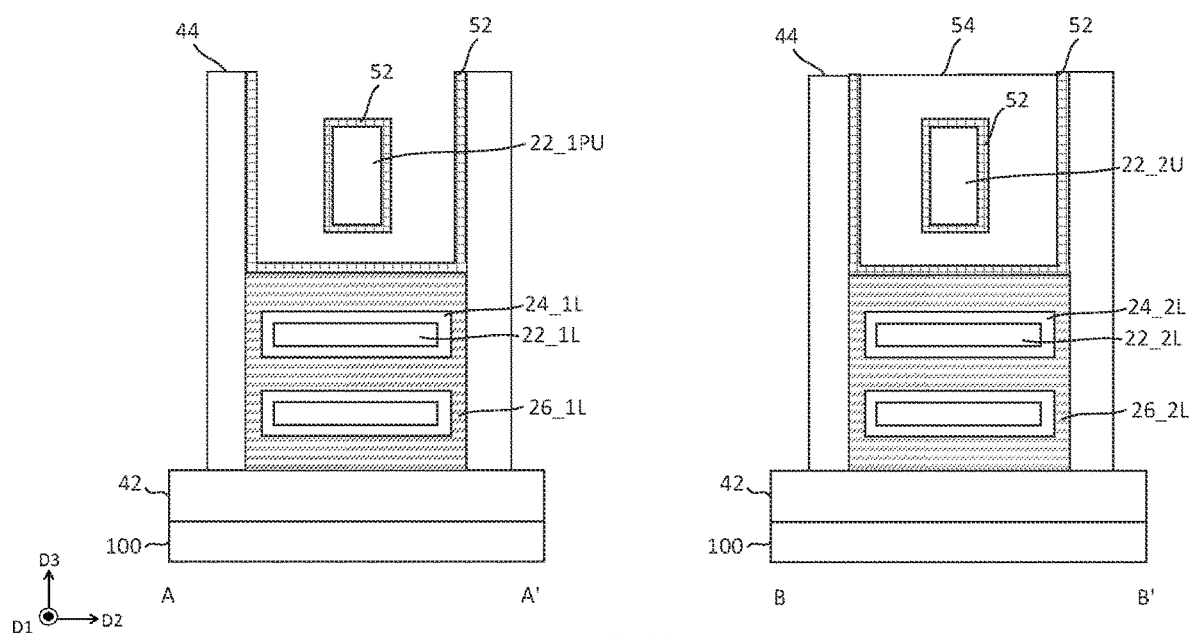

Referring to FIGS. 21 and 23, the methods may also include forming a protection layer 52 (Block 1100) on the first lower gate structure and the second lower gate structure. The protection layer 52 may be formed to have a uniform thickness on surfaces of the preliminary first upper active region 22_1PU and the second upper active region 22_2U. A mask layer 54 may be formed on the second lower gate structure and may expose the protection layer 52 formed on the preliminary first upper active region 22_1PU. For example, a preliminary mask layer may be formed on the first lower gate structure and the second lower gate structure and then a portion of the preliminary mask layer formed on the first lower gate structure may be removed to expose the protection layer 52 formed on the preliminary first upper active region 22_1PU.

Figure 24:
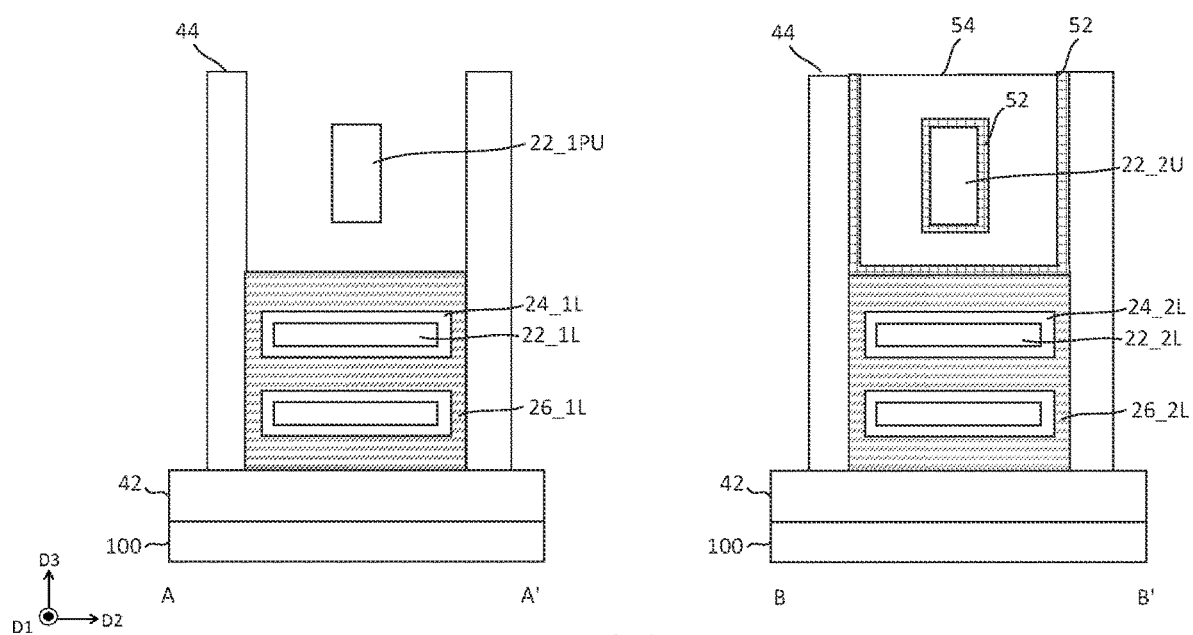

Referring to FIGS. 21 and 24, a portion of the protection layer 52 that is not covered by the mask layer 54 may be removed (Block 1200), thereby exposing the preliminary first upper active region 22_1PU.

Figure 25:
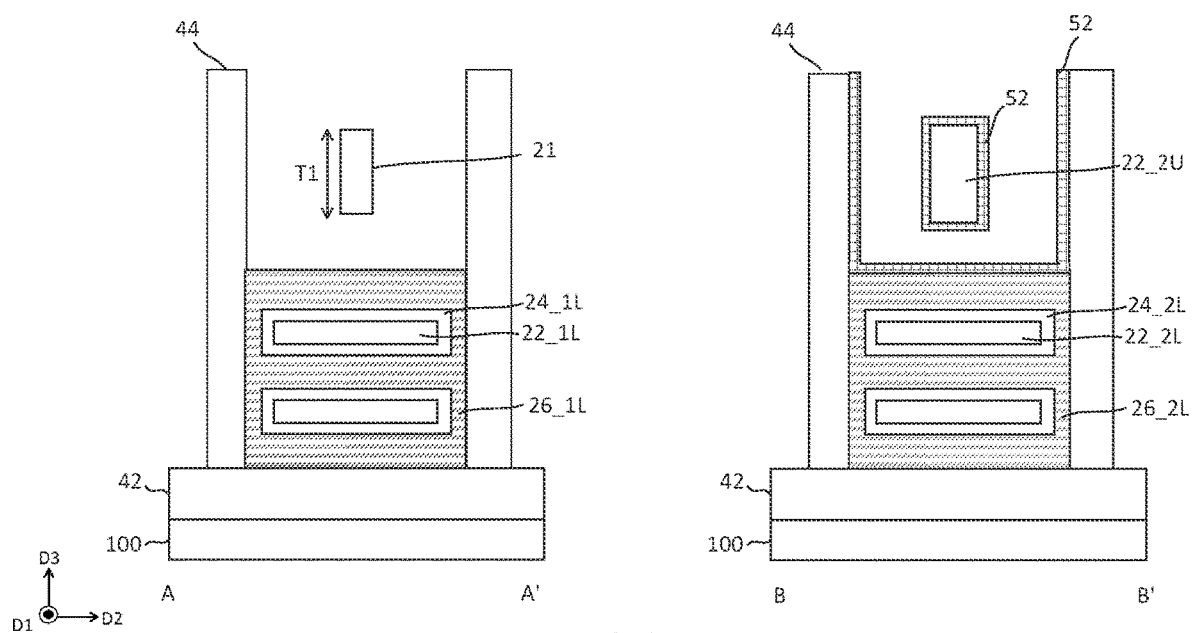
Figure 26:
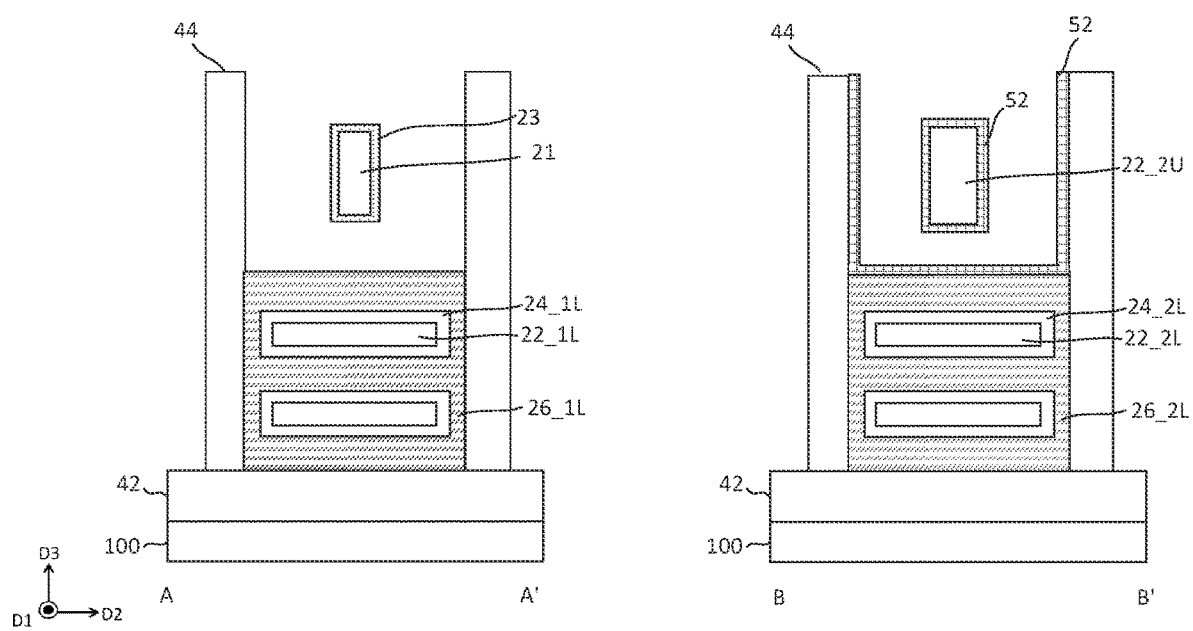

Referring to FIGS. 21 and 25, an inner layer 21 may be formed (Block 1300) by removing (e.g., isotopically etching) a portion of the preliminary first upper active region 22_1PU. Referring to FIGS. 21 and 26, an outer layer 23 may be formed (Block 1400) by, for example, performing an epitaxial growth process using the inner layer 21 as a seed layer. After the outer layer 23 is formed, the protection layer 52 formed on the second lower gate structure may be removed (Block 1500).

Referring to FIGS. 21 and FIGS. 2 and 3, upper gate structures may be formed (Block 1650) on the lower gate structures. The upper gate structures may include a first upper gate structure including the first upper gate insulator 24_1U and the first upper gate electrode 26_1U and a second upper gate structure including the second upper gate insulator 24_2U and the second upper gate electrode 26_2U.

Example embodiments are described herein with reference to the accompanying drawings. Many different forms and embodiments are possible without deviating from the scope of the present inventive concept. Accordingly, the present inventive concept should not be construed as limited to the example embodiments set forth herein. Rather, these example embodiments are provided so that this disclosure will be thorough and complete and will convey the scope of the present inventive concept to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present inventive concept.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents and shall not be restricted or limited by the foregoing detailed description.

What is claimed is:

1. A method of forming an integrated circuit device, the method comprising:
   providing a preliminary structure on a substrate, the preliminary structure comprising:
   an insulating layer including an opening;
   a preliminary upper active region in the opening; and
   a lower active region that is in the opening and is between the substrate and the preliminary upper active region;
   forming a protection layer comprising a non-conductive material that covers the lower active region while exposing the preliminary upper active region;
   forming an inner layer by etching the preliminary upper active region;
   forming an outer layer comprising a semiconductor material on the inner layer;
   forming a lower gate electrode in the opening on the lower active region; and
   forming an upper gate electrode in the opening on the outer layer.

2. The method of claim 1, wherein forming the outer layer on the inner layer comprises performing an epitaxial growth process using the inner layer as a seed layer.

3. The method of claim 2, wherein the inner layer and the outer layer comprise different materials.

4. The method of claim 3, wherein the outer layer contacts the inner layer.

5. The method of claim 3, wherein the inner layer is a silicon layer, and the outer layer is a silicon germanium layer.

6. The method of claim 3, wherein the outer layer has a uniform thickness on the inner layer.

7. The method of claim 6, wherein the uniform thickness of the outer layer is in a range of from 1 nanometer (nm) to 10 nm.

8. The method of claim 1, further comprising:
   forming a stack insulating layer,
   wherein the stack insulating layer separates the upper gate electrode from the lower gate electrode.

9. The method of claim 1, further comprising:
   forming upper source/drain regions on opposing side surfaces of the upper gate electrode, respectively,
   wherein the inner layer continuously extends between the upper source/drain regions and contacts the upper source/drain regions, and the outer layer is spaced apart from the upper source/drain regions.

10. The method of claim 9, wherein:
    the opposing side surfaces of the upper gate electrode are spaced apart from each other in a first horizontal direction;
    the inner layer has a first length in the first horizontal direction;
    the outer layer has a second length in the first horizontal direction; and
    the first length is longer than the second length.

11. The method of claim 1, further comprising:
    forming gate spacers on opposing side surfaces of the upper gate electrode, respectively,
    wherein the inner layer comprises a middle portion and an edge portion,
    the middle portion is in the upper gate electrode and has a first thickness in a vertical direction perpendicular to an upper surface of the substrate, the edge portion is in one of the gate spacers and has a second thickness in the vertical direction, and the second thickness is thicker than the first thickness.

12. The method of claim 1, wherein forming the inner layer by etching the preliminary upper active region comprises selectively etching the preliminary upper active region while the protection layer covers the lower active region.

13. The method of claim 12, wherein forming the outer layer comprises selectively epitaxially growing the outer layer on the inner layer without forming the outer layer on the lower active region.

14. A method of forming an integrated circuit device, the method comprising:
    providing a preliminary structure on a substrate, the preliminary structure comprising:
    an insulating layer including an opening;
    a preliminary upper active region in the opening; and
    a lower active region that is in the opening and is between the substrate and the preliminary upper active region;
    forming a lower gate electrode in the opening on the lower active region;

forming an inner layer by etching the preliminary upper active region, wherein the forming the lower gate electrode is performed before the forming the inner layer;

forming an outer layer on the inner layer; and forming an upper gate electrode in the opening on the outer layer.

15. A method of forming an integrated circuit device, the method comprising:

providing a preliminary structure on a substrate, the preliminary structure comprising:

an insulating layer including a first opening and a second opening;

a preliminary upper active region comprising a first preliminary upper active region in the first opening and a second preliminary upper active region in the second opening; and a lower active region comprising a first lower active region that is in the first opening and is between the substrate and the first preliminary upper active region and a second lower active region that is in the second opening and is between the substrate and the second preliminary upper active region;

forming a protection layer that covers the second preliminary upper active region while exposing the first preliminary upper active region, and;

forming an inner layer by etching the first preliminary upper active region while the protection layer covers the second preliminary upper active region;

forming an outer layer on the inner layer;

forming a lower gate electrode in the first opening on the first lower active region; and forming an upper gate electrode in the first opening on the outer layer.

* * * * *